(12) United States Patent
Konomi et al.

(10) Patent No.: US 10,109,656 B2
(45) Date of Patent: Oct. 23, 2018

(54) THIN FILM TRANSISTOR, THIN FILM TRANSISTOR SUBSTRATE, LIQUID CRYSTAL DISPLAY DEVICE, AND METHOD OF MANUFACTURING THIN FILM TRANSISTOR

(71) Applicant: Mitsubishi Electric Corporation, Tokyo (JP)

(72) Inventors: Takaharu Konomi, Kumamoto (JP); Kazunori Inoue, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/805,175

(22) Filed: Nov. 7, 2017

(65) Prior Publication Data

US 2018/0138206 A1 May 17, 2018

(30) Foreign Application Priority Data

Nov. 17, 2016 (JP) .................................. 2016-223974

(51) Int. Cl.
*G02F 1/136* (2006.01)
*H01L 27/12* (2006.01)
(Continued)

(52) U.S. Cl.
CPC .......... *H01L 27/124* (2013.01); *G02F 1/1368* (2013.01); *G02F 1/136227* (2013.01);
(Continued)

(58) Field of Classification Search
CPC ..................... G02F 1/136227; G02F 1/136286
(Continued)

(56) References Cited

U.S. PATENT DOCUMENTS 8,841,661 B2 9/2014 Akimoto et al.
9,076,875 B2 7/2015 Inoue et al.
(Continued)

FOREIGN PATENT DOCUMENTS

JP S62-235784 A 10/1987
JP 2005-077822 A 3/2005
(Continued)

OTHER PUBLICATIONS

Nomura et al.; Room-temperature fabrication of transparent flexible thin-film transistors using amorphous oxide semiconductors; Nature; Nov. 2004; No. 432; pp. 488-492.

*Primary Examiner* — Lucy Chien
(74) *Attorney, Agent, or Firm* — Studebaker & Brackett PC

(57) ABSTRACT

It is an object to provide a technique capable of suppressing a damage on a semiconductor channel layer due to a process of forming a source electrode and a drain electrode and also suppressing a short channel effect. A thin film transistor includes a gate electrode, a first insulating film, a source electrode, a drain electrode, a second insulating film, and a semiconductor channel layer that includes an oxide semiconductor. The second insulating film is disposed on the first insulating film, the source electrode, and the drain electrode. The semiconductor channel layer is electrically connected to the source electrode and the drain electrode via a first contact hole and a second contact hole provided in the second insulating film.

9 Claims, 16 Drawing Sheets

(51) Int. Cl.
   *H01L 29/786* (2006.01)
   *G02F 1/1368* (2006.01)
   *H01L 29/66* (2006.01)
   *G02F 1/1362* (2006.01)

(52) U.S. Cl.
   CPC .... *G02F 1/136286* (2013.01); *H01L 27/1225* (2013.01); *H01L 29/66969* (2013.01); *H01L 29/7869* (2013.01); *H01L 29/78696* (2013.01); *G02F 2001/13629* (2013.01); *G02F 2201/123* (2013.01)

(58) Field of Classification Search
   USPC .......................................................... 349/46
   See application file for complete search history.

(56) References Cited

U.S. PATENT DOCUMENTS

| | | | |
|---|---|---|---|
| 2009/0189153 A1 | 7/2009 | Iwasaki et al. | |
| 2010/0213461 A1* | 8/2010 | Akimoto ............. | H01L 27/1248 257/43 |
| 2013/0023086 A1 | 1/2013 | Chikama et al. | |
| 2014/0070211 A1 | 3/2014 | Iwasaki et al. | |

FOREIGN PATENT DOCUMENTS

| | | |
|---|---|---|
| JP | 2007-281409 A | 10/2007 |
| JP | 2014-036189 A | 2/2014 |
| JP | 2015-029109 A | 2/2015 |
| WO | 2011/077607 A1 | 6/2011 |

\* cited by examiner

F I G . 3
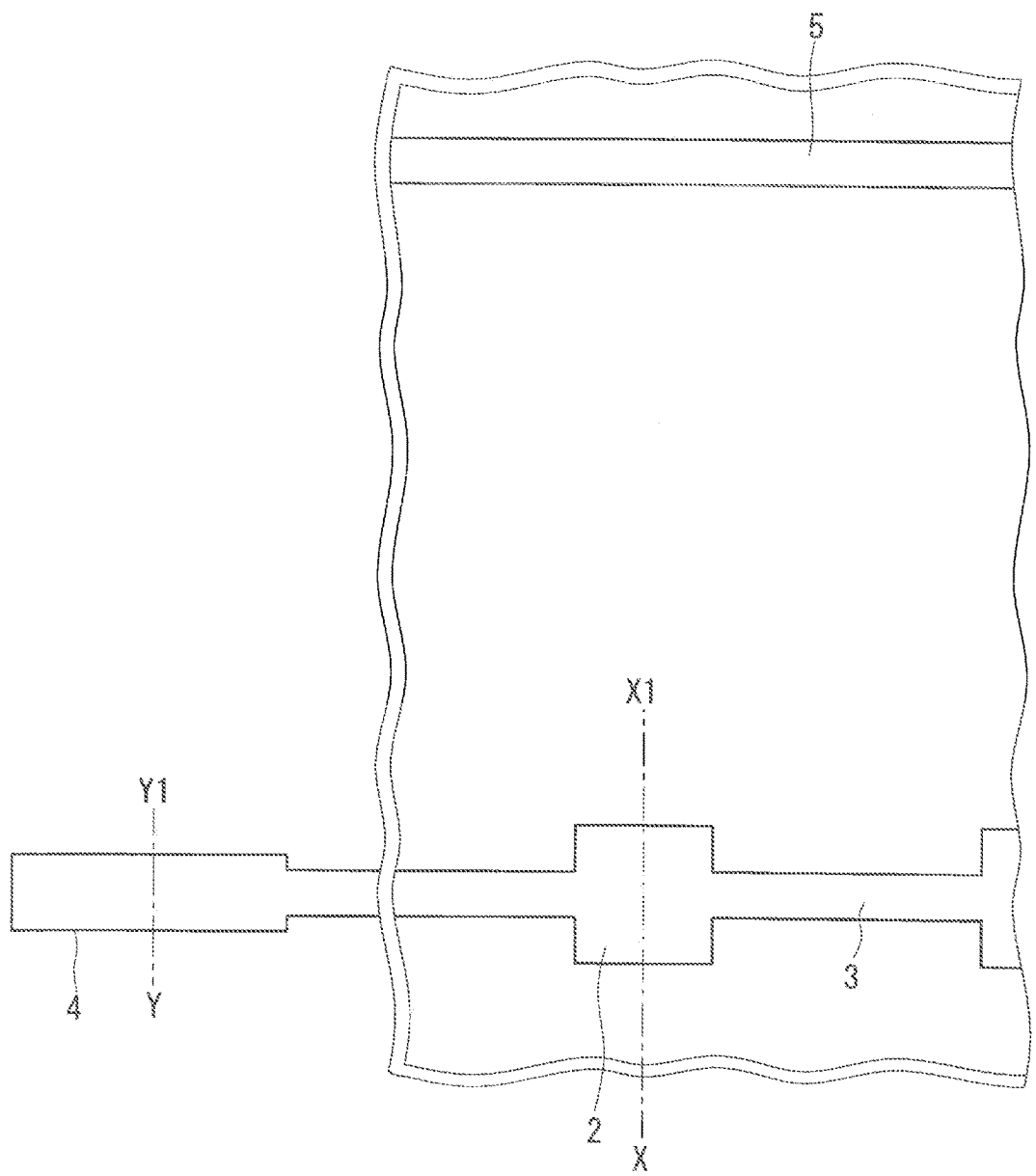

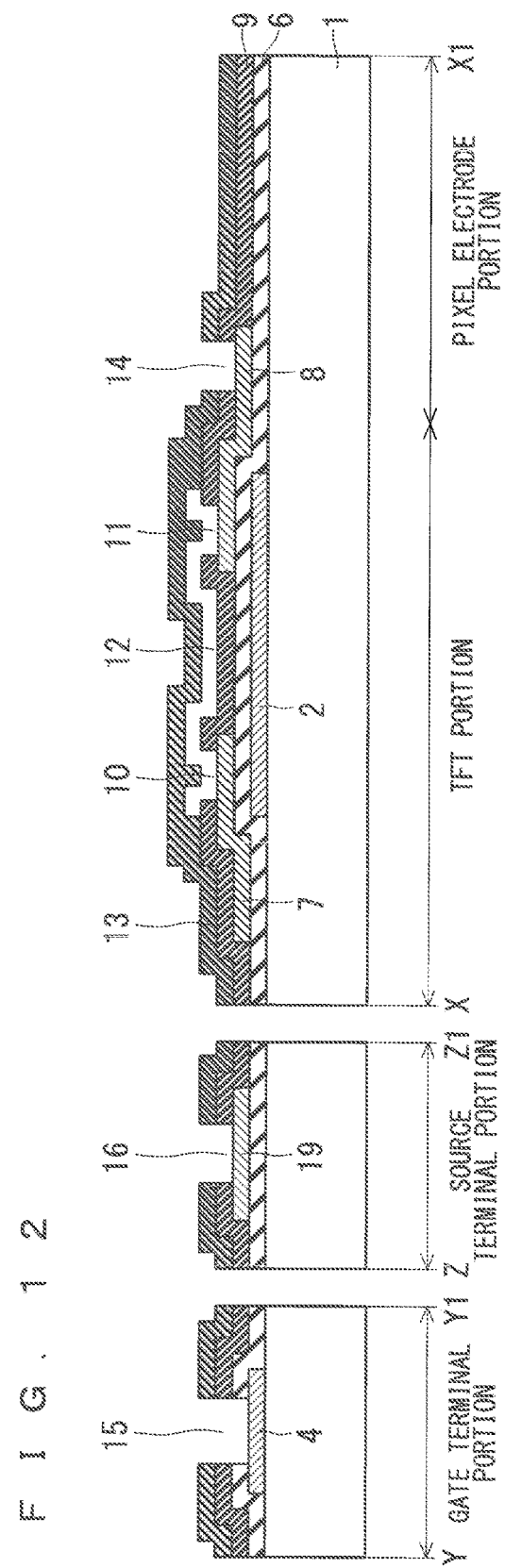

F I G . 1 3
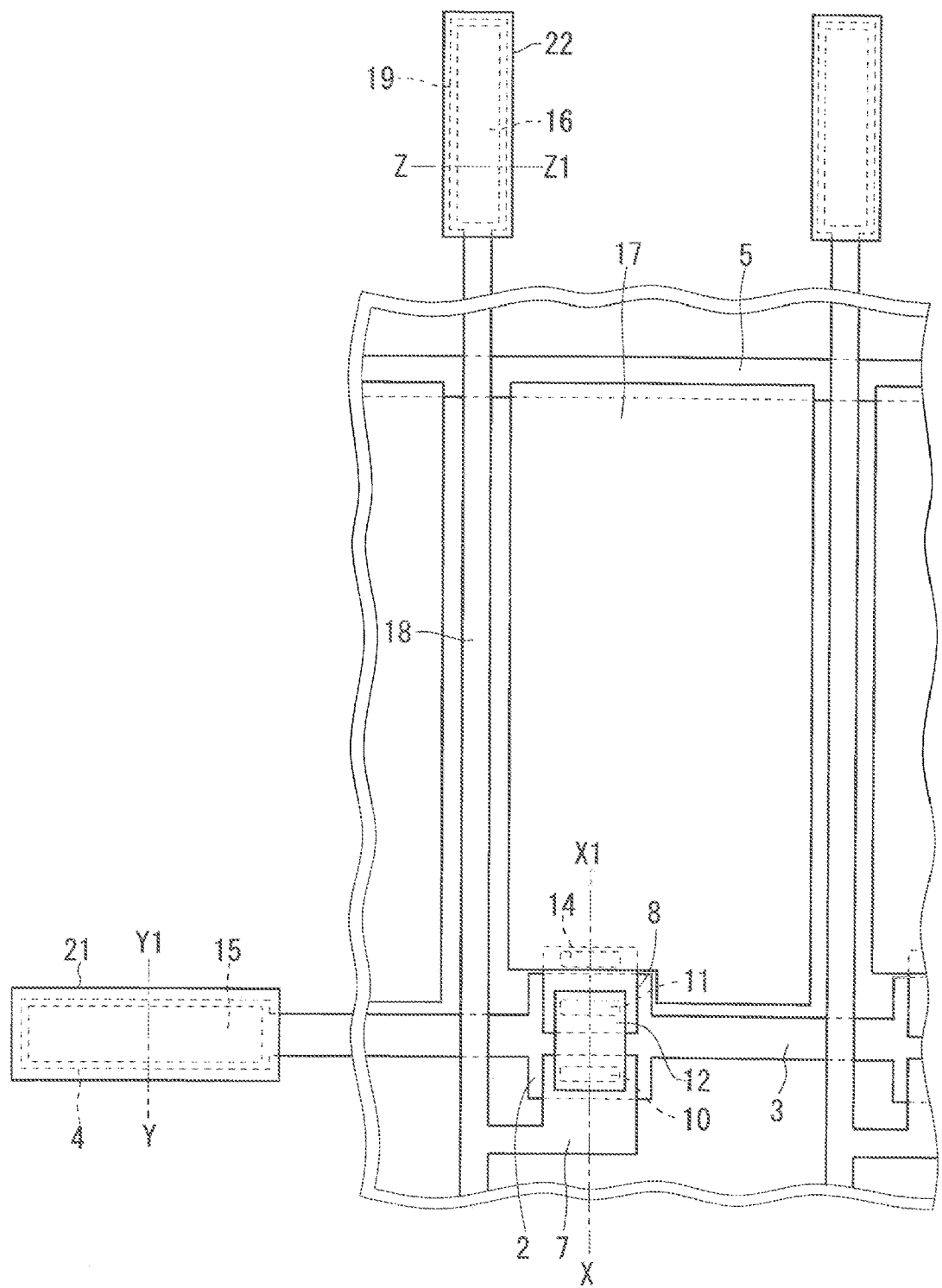

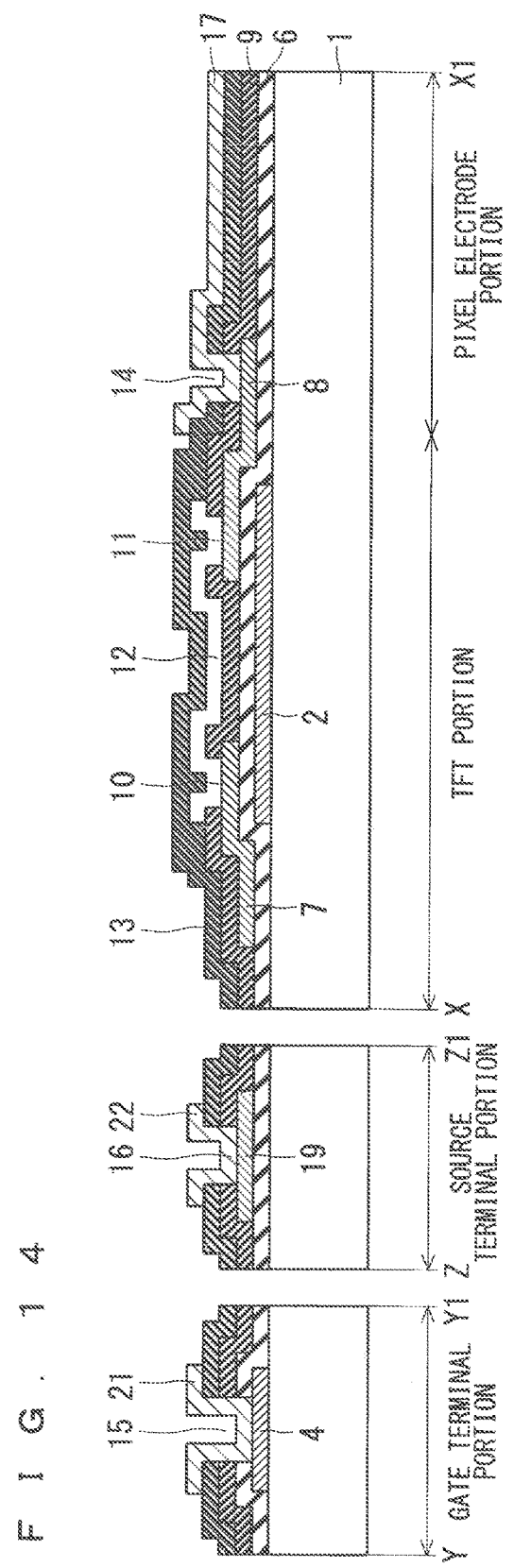

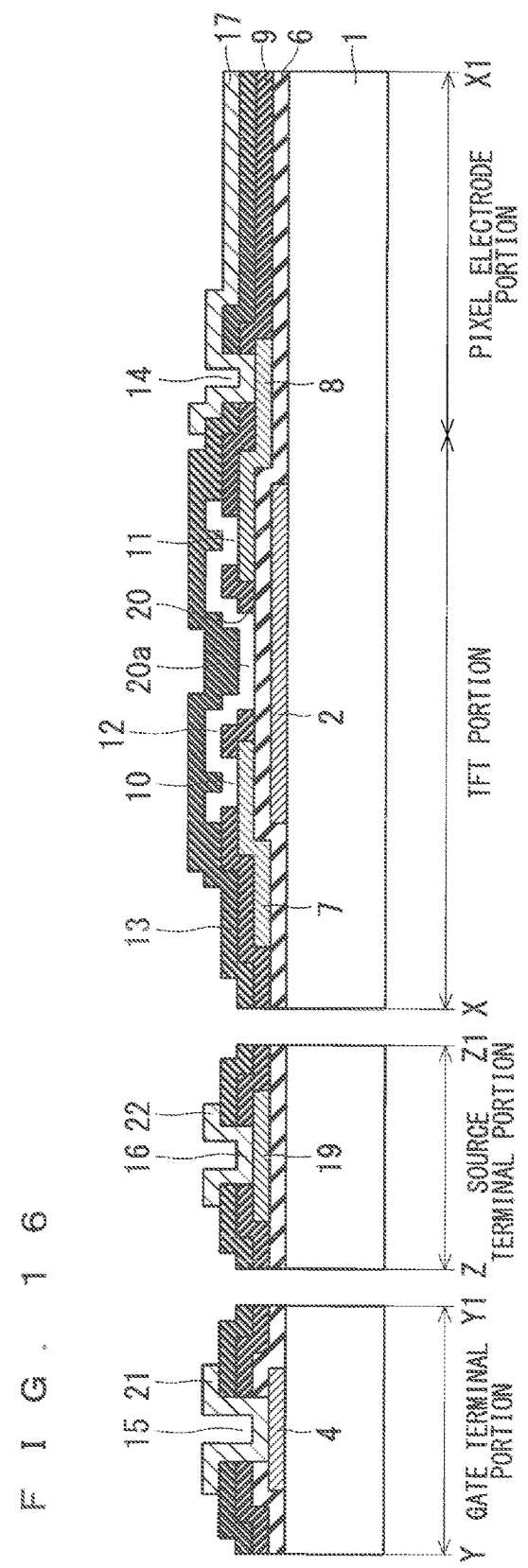

THIN FILM TRANSISTOR, THIN FILM TRANSISTOR SUBSTRATE, LIQUID CRYSTAL DISPLAY DEVICE, AND METHOD OF MANUFACTURING THIN FILM TRANSISTOR

BACKGROUND OF THE INVENTION

Field of the Invention

The present invention relates to a thin film transistor, a thin film transistor substrate, a liquid crystal display device, and a method of manufacturing the thin film transistor.

Description of the Background Art

Known is a thin film transistor (referred to as "the TFT") active matrix substrate, which is a type of thin film transistor substrate (referred to as "the TFT substrate" hereinafter) including the TFT as a switching element. The TFT active matrix substrate is used in an electro-optical apparatus such as a liquid crystal display device which is a display device including a liquid crystal, for example. A semiconductor device such as the TFT has a feature of being power-thrifty and thin, thus being used in place of a cathode ray tube (CRT) and finding increasing applications to a flat panel display.

An electro-optical element for use in a liquid crystal display (hereinafter also referred to as "the LCD") includes a passive matrix LCD and a TFT-LCD including the TFT as a switching element for each pixel. In particular, the TFT-LCD are superior in portability and display quality to the CRT and the passive matrix LCD, thus finding widespread practical applications to a display product such as a notebook computer and a TV.

In general, the TFT-LCD includes a liquid crystal display panel in which a liquid crystal layer is sandwiched between a TFT substrate and a counter substrate. The TFT substrate includes an array of a plurality of TFTs and the counter substrate includes, for example, a color filter. The liquid crystal display panel includes polarizing plates located on a front surface side and a back surface side and a backlight located on one of these sides. This structure provides an excellent color display.

A drive system of a conventional TFT-LCD includes a vertical electric field type LCD having a twisted nematic (TN) mode or a vertical alignment (VA) mode and includes an in-plane switching (IPS) (registered trademark) type LCD having a transverse electric field liquid crystal drive system yielding an improvement in a viewing angle. The IPS-LCD has the advantage in wide viewing angle and thus is widely used in, for example, a display device. However, the IPS-LCD has a low aperture ratio and a low transmittance in a pixel display portion, and thus, can hardly have bright display properties. It is considered that the following factor plays a major role in interfering with the bright display properties. An electric field for driving a liquid crystal fails to work properly above a comb-teeth shaped pixel electrode included in the IPS-LCD, so that a part of the liquid crystal located above the pixel electrode is not driven. To solve this problem, an LCD disclosed in, for example, Japanese Patent Application Laid-Open No. 2005-77822 which employs a fringe field switching (FFS) system has been proposed.

For the switching element of the TFT substrate included in the conventional liquid crystal display device, amorphous silicon (Si) has been used as the semiconductor film being an active layer, that is to say, a channel layer. In recent years, the TFT including an active layer made of an oxide semiconductor, which has a higher mobility than that of a conventionally-used amorphous silicon, has been actively developed. The oxide semiconductor is mainly made of a material based on zinc oxide (ZnO) or a material based on amorphous InGaZnO obtained by adding gallium oxide ($Ga_2O_3$) and indium oxide ($In_2O_3$) to zinc oxide (for example, Japanese Patent Application Laid-Open No. 2005-77822, Japanese Patent Application Laid-Open No. 2007-281409, and Kenji Nomura, et al., "Room-temperature fabrication of transparent flexible thin-film transistors using amorphous oxide semiconductors," Nature, November 2004, no. 432, pp. 488-492).

Similarly to an oxide conductor being a transparent conductor such as amorphous ITO (indium oxide ($In_2O_3$)+tin oxide ($SnO_2$)) and amorphous InZnO (indium oxide ($In_2O_3$)+zinc oxide (ZnO)), the above-mentioned oxide semiconductor can be etched with a weak acid solution containing oxalic acid or carboxylic acid. The oxide semiconductor therefore has an advantage of being easily patterned.

However, the oxide semiconductor is damaged by the acid solution used to etch a general metal film made of Cr, Ti, Mo, Ta, Al, Cu or an alloy of them, for example, to be formed into a source electrode and a drain electrode of the TFT. This causes a characteristics degradation in the oxide semiconductor, or the oxide semiconductor made of a certain kind of material may dissolve in the above-mentioned acid solution. That is to say, as described in FIG. 11(b) in Japanese Patent Application Laid-Open No. 2007-281409, for manufacturing the TFT generally referred to as back channel etch (BCE) TFT including the source electrode and the drain electrode as an upper layer on the oxide semiconductor film, the oxide semiconductor film being the channel layer is damaged by the acid solution in some cases during the processing of the source electrode and the drain electrode, resulting in the degradation in the TFT characteristics. In other cases, the oxide semiconductor film being the channel layer is damaged due to the oxidation-reduction reaction in the interface between the metal film and the oxide semiconductor during the deposition of the metal film which is to be formed into the source electrode and the drain electrode, causing the further degradation of the TFT characteristics.

These problems can be solved by applying the TFT structure that includes, as an upper layer on the semiconductor layer, a protective insulation layer as described in FIG. 1 in Japanese Patent Application Laid-Open No. 62-235784 and FIG. 6 in International Publication No. WO 2011/077607. Such a TFT structure is generally referred to as an "etching stopper" or "etch stopper (ES) TFT", and the protective insulation layer can prevent a damage on the oxide semiconductor film during the etching of the metal film which is to be formed into the source electrode and the drain electrode or loss of the oxide semiconductor film due to the etching. Also proposed as the TFT including the oxide semiconductor film is a structure described in Japanese Patent Application Laid-Open No. 2015-029109.

SUMMARY

Problem to be Solved by the Invention

However, in manufacturing the TFT substrate including the ES TFT, a protective insulation film made of a silicon oxide film or a silicon nitride film is formed as an ES layer, and the ES layer is patterned by a dry etching. An additional problem occurs in the techniques of Japanese Patent Application Laid-Open No. 62-235784 and International Publication No. WO 2011/077607, that is, the oxide semiconductor film is damaged in the patterning, and the TFT characteristics are thereby degraded.

When the metal film which is to be formed into the source electrode and the drain electrode is deposited directly onto the oxide semiconductor film by sputtering or chemical vapor deposition, an interface reaction of reducing the oxide semiconductor film occurs in the source region and the drain region where the oxide semiconductor film is electrically connected to the source electrode and the drain electrode. The influence of the reduction may spread to the whole semiconductor layer including the channel region, thereby causing the degradation in the TFT characteristics.

In the meanwhile, Japanese Patent Application Laid-Open No. 2015-029109 discloses in FIG. 1 a structure of forming a semiconductor channel layer after forming the source electrode and the drain electrode as one of methods of solving the process damage of the TFT described above.

Such a structure suppresses a reduction in a reliability of the TFT-LCD due to the damage on the oxide semiconductor film. However, since the source electrode and the drain electrode are directly formed below the channel layer made of the oxide semiconductor, an additional problem occurs, that is, the TFT characteristics are degraded by a short channel effect such as a reduction in a threshold voltage which occurs when the TFT has a fine structure.

The present invention is made to solve the above problems, and it is an object of the present invention to provide a technique capable of suppressing a damage on a semiconductor channel layer caused by a process of forming a source electrode and a drain electrode and also suppressing a short channel effect.

Means to Solve the Problem

The present invention is a thin film transistor including a gate electrode, a first insulating film, a source electrode, a drain electrode, a second insulating film, and a semiconductor channel layer that includes an oxide semiconductor. The gate electrode is disposed on a substrate. The first insulating film covers the gate electrode. The source electrode and the drain electrode are disposed on the first insulating film and separated from each other on an upper side of the gate electrode. The second insulating film is disposed on the first insulating film, the source electrode, and the drain electrode. The semiconductor channel layer is electrically connected to the source electrode and the drain electrode via a first contact hole and a second contact hole provided in the second insulating film.

Effects of the Invention

A damage on the semiconductor channel layer caused by the process of forming the source electrode and the drain electrode can be suppressed, and a short channel effect can be also suppressed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a plan view illustrating a method of manufacturing the TFT substrate according to the embodiment 1.

FIG. 12 is a cross-sectional view illustrating a method of manufacturing the TFT substrate according to the embodiment 1.

FIG. 13 is a plan view illustrating a method of manufacturing the TFT substrate according to the embodiment 1.

FIG. 14 is a cross-sectional view illustrating a method of manufacturing the TFT substrate according to the embodiment 1.

FIG. 16 is a cross-sectional view illustrating a configuration of a TFT substrate according to the embodiment 2.

DESCRIPTION OF THE PREFERRED EMBODIMENTS

Embodiment 1

Figure 1:
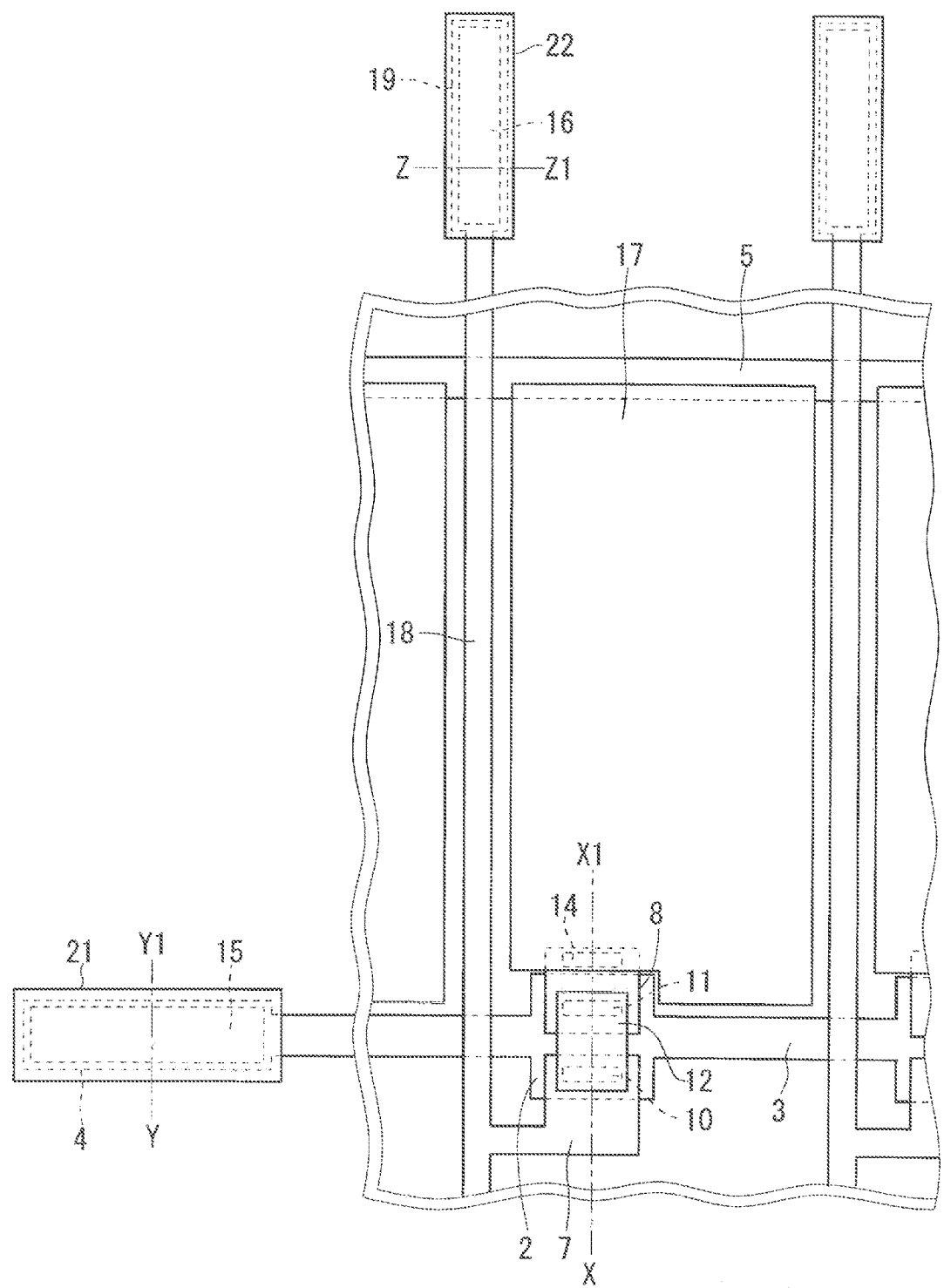
FIG. 1 is a plan view illustrating a configuration of a TFT substrate according to an embodiment 1.
Figure 2:
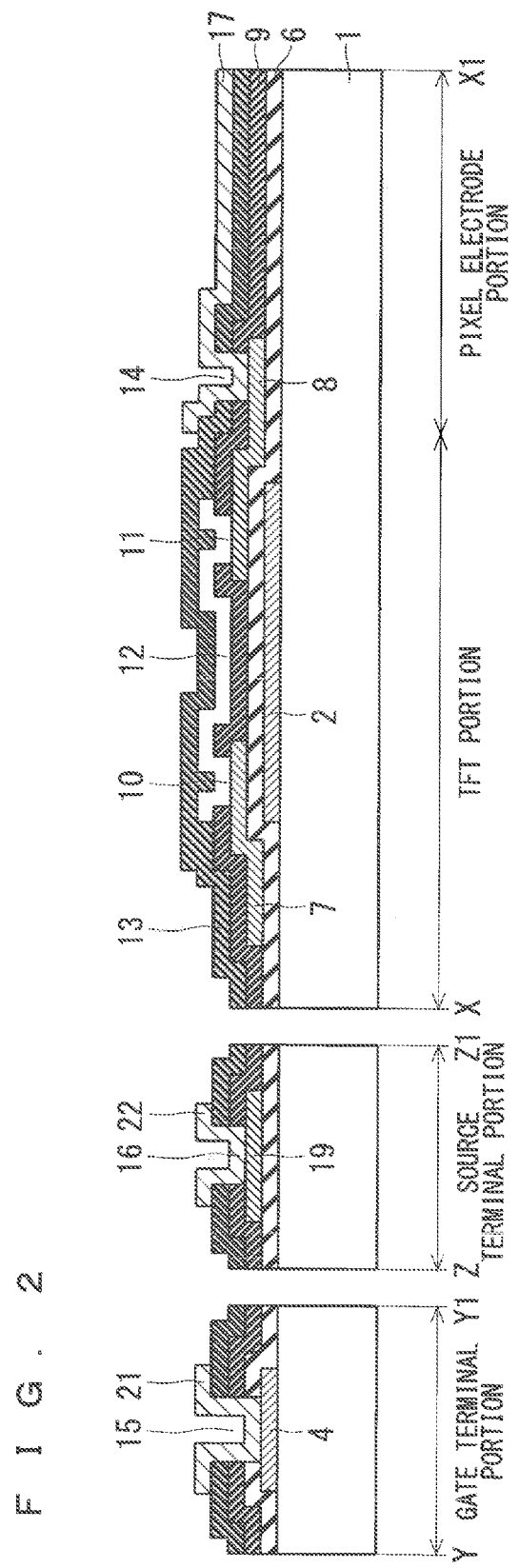
FIG. 2 is a cross-sectional view illustrating a configuration of the TFT substrate according to the embodiment 1.

A configuration of a TFT substrate according to the embodiment 1 of the present invention is described with reference to FIG. 1 and FIG. 2. FIG. 1 is a planar view of the planar configuration of a pixel portion in a pixel display region in the TFT substrate in a TN mode and a gate terminal portion and a source terminal portion outside the pixel display region in the TFT substrate, and FIG. 2 is a cross-sectional view of the cross-sectional configuration of these portions. FIG. 2 corresponds to cross sections taken along a line X-X1, a line Y-Y1, and a line Z-Z1 illustrated in FIG. 1. The cross section taken along the line X-X1 corresponds to a part of the pixel portion being the region in which pixels are formed. The cross section taken along the line Y-Y1 corresponds to a gate terminal 4 for supplying a gate signal to a gate wire 3 (FIG. 1). The cross section taken along the line Z-Z1 corresponds to a source terminal 19 for applying a display signal to the source wire 18 (FIG. 1). As shown in FIG. 2, the cross section of the pixel portion includes, along the line X-X1, "a TFT portion" being the region in which the TFT is formed and "a pixel electrode portion" being the region in which a pixel electrode 17 is formed.

As shown in FIG. 1 and FIG. 2, the TFT substrate includes a substrate 1 which is a transparent insulating substrate made of, for example, glass, a TFT, the gate wire 3, the gate terminal 4, a common wire 5, the pixel electrode 17, the source wire 18, a source terminal 19, a gate terminal pad 21, and a source terminal pad 22. The TFT includes a gate electrode 2, a first insulating film 6, a source electrode 7, a drain electrode 8, a second insulating film 9, a semiconductor channel layer 12, and a third insulating film 13 illustrated in FIG. 2.

As illustrated in FIG. 2, the gate electrode 2 and the gate terminal 4 are disposed on the substrate 1, and the gate wire 3 and the common wire 5 illustrated in FIG. 1 are also disposed on the substrate 1 in a manner similar to the gate electrode 2 and the gate terminal 4. The gate wire 3 extends in a lateral direction. The gate electrode 2 in the TFT constitutes a part of the gate wire 3, and the part of the TFT portion in the gate wire 3 constitutes the gate electrode 2. The gate electrode 2 according to the embodiment 1 has a width larger than that of the remaining part of the gate wire 3. The gate terminal 4 is formed in one end portion of the gate wire 3. The common wire 5 is disposed to be separated from the gate electrode 2 and the gate wire 3, and extends in parallel with the gate wire 3.

As illustrated in FIG. 2, the first insulating film 6 is disposed on the gate electrode 2, the gate wire 3, the gate terminal 4, and the common wire 5 to cover them. The first insulating film 6 functions as a gate insulating film in the TFT portion, and thus, is hereinafter also referred to as "the gate insulating film 6" in some cases.

As illustrated in FIG. 2, the source electrode 7, the drain electrode 8, and the source terminal 19 are disposed on the first insulating film 6, and the source wire 18 illustrated in FIG. 1 is also disposed on the first insulating film 6 in a manner similar to the source electrode 7, the drain electrode 8, and the source terminal 19. As illustrated in FIG. 1 and FIG. 2, the source electrode 7 and the drain electrode 8 are separated from each other on an upper side of the gate electrode 2 with the second insulating film 9 between the source electrode 7 and the drain electrode 8. The source electrode 7 in the TFT is connected to the source wire 18, and the source terminal 19 is formed in one end portion of the source wire 18.

As illustrated in FIG. 2, the second insulating film 9 made up of the protective insulation layer is disposed on the gate terminal 4, the first insulating film 6, the source electrode 7, the drain electrode 8, the source wire 18, and the source terminal 19. A first contact hole 10 and a second contact hole 11 are located in a part of the source electrode 7 and drain electrode 8 in the second insulating film 9, respectively. In the embodiment 1, the first contact hole 10 is located on an inner portion of the source electrode 7 other than an end portion thereof, and the second contact hole 11 is located on an inner portion of the drain electrode 8 other than an end portion thereof.

The semiconductor channel layer 12 is a film or a layer including an oxide semiconductor, and is electrically connected to the source electrode 7 and the drain electrode 8 via the first contact hole 10 and the second contact hole 11. The oxide semiconductor may be, for example, an oxide semiconductor based on zinc oxide (ZnO), an oxide semiconductor based on InZnSnO obtained by adding indium oxide ($In_2O_3$) and tin oxide ($SnO_2$) to zinc oxide (ZnO), or an oxide semiconductor based on InGaZnO obtained by adding gallium oxide ($Ga_2O_3$) and indium oxide ($In_2O_3$) to an oxide semiconductor based on zinc oxide (ZnO) or zinc oxide (ZnO). The semiconductor channel layer 12 made of the oxide semiconductor can achieve a higher mobility than the semiconductor channel layer 12 made of amorphous silicon. As illustrated in FIG. 2, the semiconductor channel layer 12 according to the embodiment 1 is disposed on an upper side of the gate electrode 2 and on at least one of the second insulating film 9, the source electrode 7, and the drain electrode 8.

As illustrated in FIG. 2, the third insulating film 13 is disposed on the second insulating film 9 and the semiconductor channel layer 12. A third contact hole 14, a fourth contact hole 15, and a fifth contact hole 16 are provided on the drain electrode 8, the gate terminal 4, and the source terminal 19, respectively. The pixel electrode 17 is electrically connected to the drain electrode 8 via the third contact hole 14 of the second insulating film 9 and the third insulating film 13. The gate terminal pad 21 is electrically connected to the gate terminal 4 and further the gate electrode 2 via the fourth contact hole 15 of the first insulating film 6, the second insulating film 9, and the third insulating film 13. The source terminal pad 22 is electrically connected to the source terminal 19 and further the source electrode 7 via the fifth contact hole 16 of the second insulating film 9 and the third insulating film 13.

<Manufacturing Method>

Next, a method of manufacturing the TFT substrate according to the embodiment 1 is described with reference to FIG. 3 to FIG. 14. In FIG. 3 to FIG. 14, constituent components corresponding to the constituent components shown in FIG. 1 and FIG. 2 are denoted by the same reference signs in FIG. 1 and FIG. 2. FIG. 3, FIG. 5, FIG. 7, FIG. 9, FIG. 11, and FIG. 13 are planar process drawings illustrating the method of manufacturing the TFT substrate of the embodiment 1, and FIG. 4, FIG. 6, FIG. 8, FIG. 10, FIG. 12, and FIG. 14 are cross-sectional process drawings each illustrating a cross-sectional configuration taken along the line X-X1, the line Y-Y1, and the line Z-Z1 in the planar process drawings.

Firstly, the substrate 1 is cleaned with cleaning fluid or pure water. In the embodiment 1, the glass substrate having a thickness of 0.5 mm is used as the substrate 1. Then, a first conductive film being the material of, for example, the gate electrode 2 and the gate wire 3 is deposited on the entirety of one main surface of the cleaned substrate 1.

The first conductive film may be, for example, a metal such as chromium (Cr), molybdenum (Mo), titanium (Ti), copper (Cu), tantalum (Ta), tungsten (W) or aluminum (Al) or an alloy obtained by adding at least one different element to the above-mentioned metallic element being the base component. Herein, the base component element is the element of the highest content among the elements contained in the alloy. The first conductive film may have a laminated structure including at least two layers of such metal or alloy. A low-resistant first conductive film having a specific resistance value of 50 $\mu\Omega$ cm or less can be made of such metal or alloy.

In the embodiment 1, an aluminum (Al) alloy film having a thickness of 200 nm is deposited as the first conductive film by sputtering, using argon (Ar) gas. Then, a photoresist material is applied onto the first conductive film. In a first photolithography process, the photoresist material is formed into a photoresist pattern and an Al alloy film which is the first conductive film is etched to be patterned, using the photoresist pattern as a mask. Herein, the Al alloy film is wet-etched with a solution (PAN chemical solution) containing, for example, phosphoric acid, acetic acid, and nitric acid.

Figure 4:
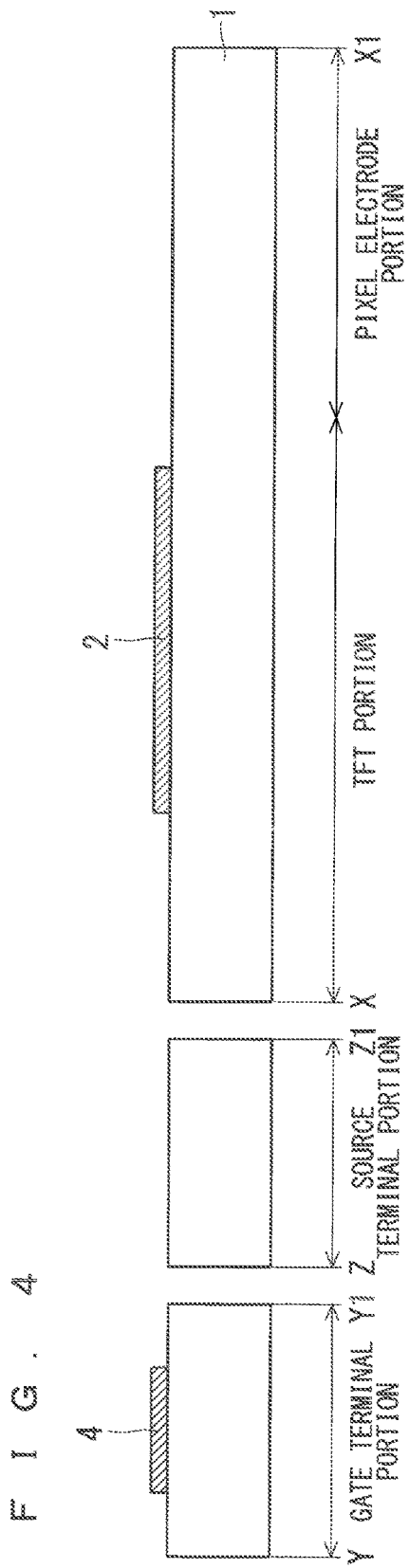
FIG. 4 is a cross-sectional view illustrating a method of manufacturing the TFT substrate according to the embodiment 1.

Accordingly, as shown in FIG. 3 and FIG. 4, the gate electrode 2, the gate wire 3, the gate terminal 4, and the common wire 5 are formed on the substrate 1. Then, the photoresist pattern not shown is removed.

Next, the first insulating film 6 which is to be the material of the gate insulating film is deposited on the entire upper surface of the substrate 1 to cover the gate electrode 2, the gate wire 3, the gate terminal 4, and the common wire 5. In the embodiment 1, a silicon nitride (SiN) film having a thickness of 400 nm and a silicon oxide (SiO) film having a thickness of 50 nm are formed in this order by chemical vapor deposition (CVD) to form the first insulating film 6 including an SiO film as an upper layer and a SiN film as a lower layer. The SiO film has poor barrier properties, that is to say, poor shielding properties against impurity elements, such as water ($H_2O$), hydrogen ($H_2$), sodium (Na), and potassium (K), affecting the TFT characteristics. Thus, in the embodiment 1, a laminated structure including, for example, the SiN film having excellent barrier properties as the lower layer below the SiO film is formed as the first insulating film 6. The first insulating film 6 functions as the gate insulating film 6 in the TFT forming region.

Subsequently, a second conductive film which is a material of the source electrode 7, the drain electrode 8, the source wire 18, and the source terminal 19, for example, is deposited on the first insulating film 6. A material similar to that of the first conductive film can be applied to the second conductive film. In the embodiment 1, a laminated structure is formed by laminating a plurality of alloys obtained by adding trace amounts of another element to each of Mo and Al to form the second conductive film.

Then, a photoresist pattern is formed in a second photolithography process, and a film including a lamination of Al alloy and Mo alloy which is the second conductive film is etched to be patterned, using the photoresist pattern as a mask. The second conductive film may be wet-etched with a PAN chemical solution. Herein, the second conductive film is etched with the PAN chemical solution containing 70 wt % phosphoric acid, 7 wt % acetic acid, 5 wt % nitric acid, and water. Since the film including the lamination of Al alloy and Mo alloy is etched in this stage, the semiconductor channel layer 12 which is made up of the oxide semiconductor is not damaged by the chemical solution used for the etching.

Figure 5:
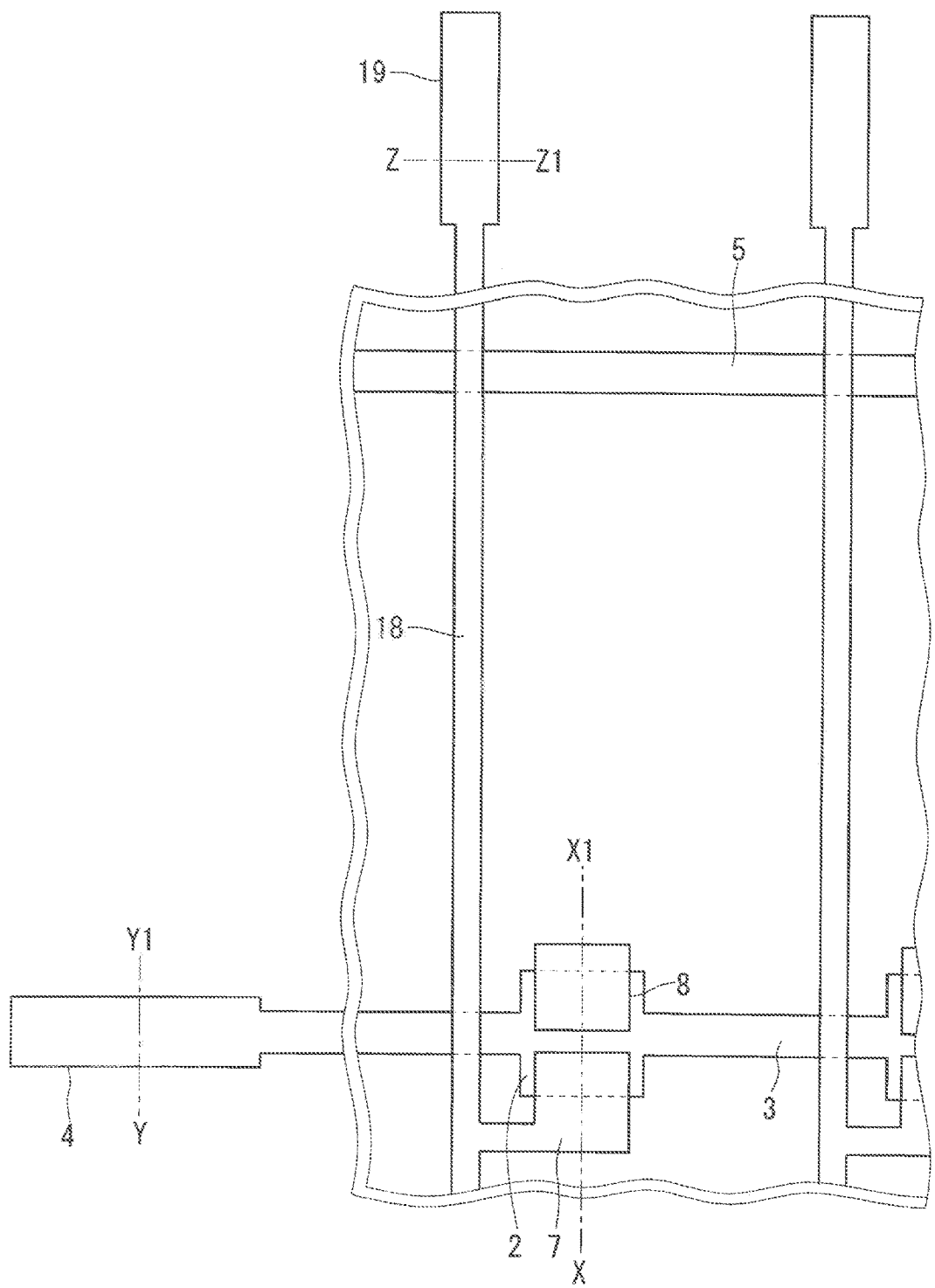
FIG. 5 is a plan view illustrating a method of manufacturing the TFT substrate according to the embodiment 1.
Figure 6:
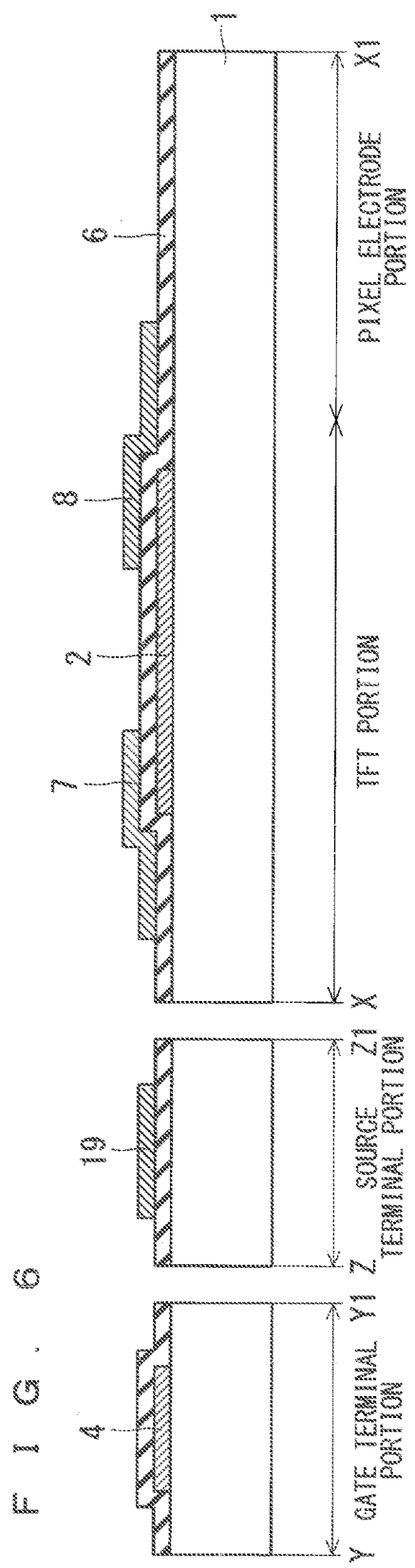
FIG. 6 is a cross-sectional view illustrating a method of manufacturing the TFT substrate according to the embodiment 1.

As described above, the source electrode 7, the drain electrode 8, the source wire 18, and the source terminal 19 are deposited on the first insulating film 6 as illustrated in FIG. 5 and FIG. 6. Then, the photoresist pattern not shown is removed.

Next, the second insulating film 9 is deposited on the first insulating film 6, the source electrode 7, and the drain electrode 8. In the embodiment 1, a SiO film having a thickness of 100 nm is formed as the second insulating film 9 by CVD. The configuration of the second insulating film 9 is not limited thereto, but a laminated structure including the SiO film as the upper layer and the SiN film as the lower layer may be formed as the second insulating film 9.

Then, a photoresist pattern is formed in a third photolithography process, and the second insulating film 9 on the source electrode 7 and the drain electrode 8 is etched to be patterned, using the photoresist pattern as a mask. The second insulating film 9 may be dry-etched with a gas containing fluorine. In the embodiment 1, the second insulating film 9 is dry-etched with a gas obtained by adding oxygen ($O_2$) to sulfur hexafluoride ($SF_6$).

As described above, as illustrated in FIG. 7 and FIG. 8, the first contact hole 10 and the second contact hole 11 are formed in the region located on the source electrode 7 and drain electrode 8 in the second insulating film 9 and overlapping the gate electrode 2 in a planar view. Then, the photoresist pattern not shown is removed.

Then, an oxide semiconductor being the material of the semiconductor channel layer 12 is deposited on the second insulating film 9, for example. In the embodiment 1, an oxide containing In, Ga, and Zn such as InGaZnO, for example, is used as the oxide semiconductor. Specifically, an oxide semiconductor film corresponding to an oxide semiconductor layer made of InGaZnO is deposited by sputtering, using an In—Ga—Zn—O target [$In_2O_3.Ga_2O_3.(ZnO)_2$] in which the atomic composition ratio of In:Ga:Zn:O is 1:1:1:4. The oxide semiconductor film deposited as described above usually has an atomic composition ratio of oxygen that is smaller than the stoichiometry composition. Consequently, the oxide semiconductor film becomes deficient in oxygen ion (the composition ratio of O is less than 4 in the above example). Thus, Ar gas mixed with oxygen ($O_2$) gas is preferably used for sputtering. In the embodiment 1, a sputtering is performed using Ar gas containing $O_2$ gas mixed at 10% by partial pressure ratio, whereby an InGaZnO film of an amorphous structure having a thickness of 50 nm is deposited. The InGaZnO film having the amorphous structure usually has a crystallization temperature of 500° C. or higher. Thus, at room temperature, the majority of the InGaZnO film has the amorphous structure with stability.

Then, a photoresist pattern is formed in a fourth photolithography process, and the oxide semiconductor film is etched to be patterned, using the photoresist pattern as a mask. The oxide semiconductor film may be wet-etched with a chemical solution containing carboxylic acid. The chemical solution containing carboxylic acid preferably has an oxalic acid content of 1 to 10 wt %. In the embodiment 1, the oxide semiconductor film is etched with an oxalic-acid-based chemical solution containing 5 wt % oxalic acid and water. Since the source electrode 7 and the drain electrode 8 are already formed in this stage, the PAN chemical solution, which is used at the time of etching the film including the lamination of Al alloy and Mo alloy, does not damage the oxide semiconductor film or does not cause an interface reaction at the time of forming the laminated film.

Figure 9:
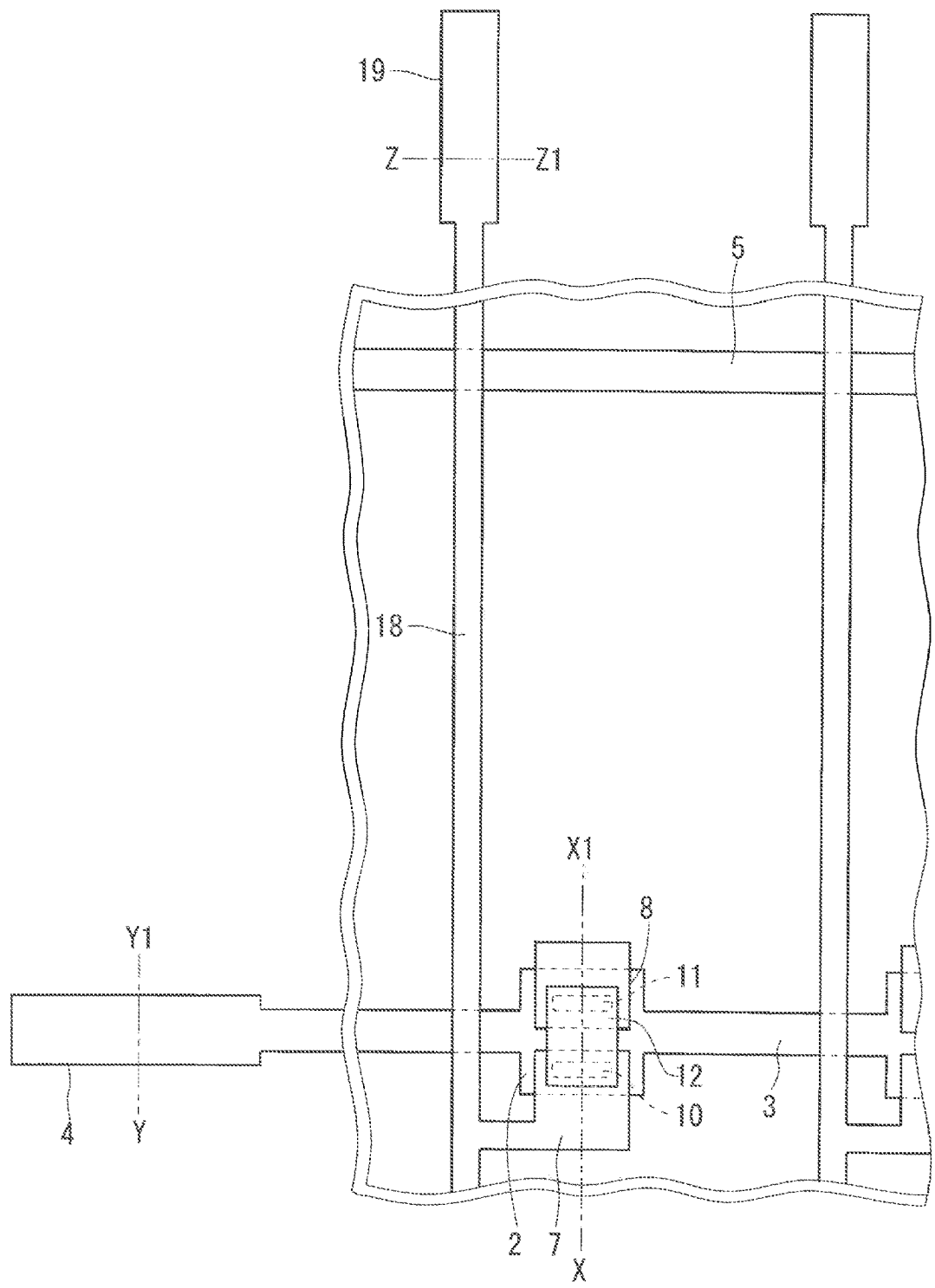
FIG. 9 is a plan view illustrating a method of manufacturing the TFT substrate according to the embodiment 1.
Figure 10:
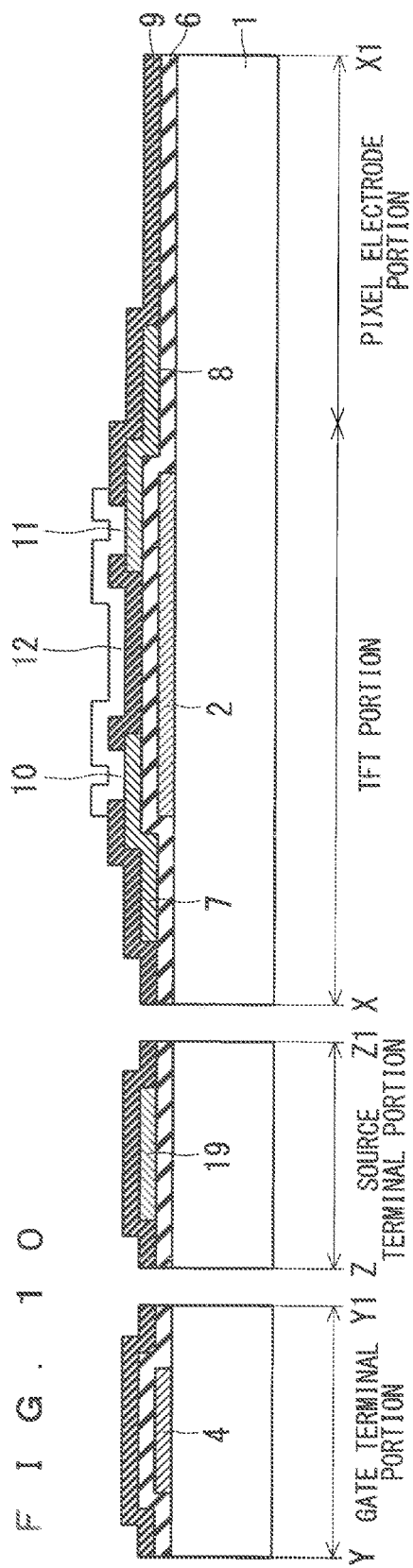
FIG. 10 is a cross-sectional view illustrating a method of manufacturing the TFT substrate according to the embodiment 1.

Accordingly, the semiconductor channel layer 12 is formed as illustrated in FIG. 9 and FIG. 10. The source electrode 7 and the drain electrode 8 are electrically connected to the oxide semiconductor film via the first contact hole 10 and the second contact hole 11. Then, the photoresist pattern not shown is removed.

After forming the semiconductor channel layer 12, the third insulating film 13 is deposited on the entire upper surface of the second insulating film 9 and the semiconductor channel layer 12, for example. In the embodiment 1, an SiO film having a thickness of 200 nm and an SiN film having a thickness of 100 nm are deposited in this order by CVD to form a laminated structure, which includes the SiO film as the upper layer and the SiN film as the lower layer, as the third insulating film 13.

Then, a photoresist pattern is formed in a fifth photolithography process, and the third insulating film 13, the second insulating film 9, and the first insulating film 6 are etched to be patterned, using the photoresist pattern as a mask. The third insulating film 13, the second insulating film 9, and the first insulating film 6 may be dry-etched with a gas containing fluorine. In the embodiment 1, the third insulating film 13, the second insulating film 9, and the first insulating film 6 are dry-etched with a gas obtained by adding $O_2$ to $SF_6$.

Figure 11:
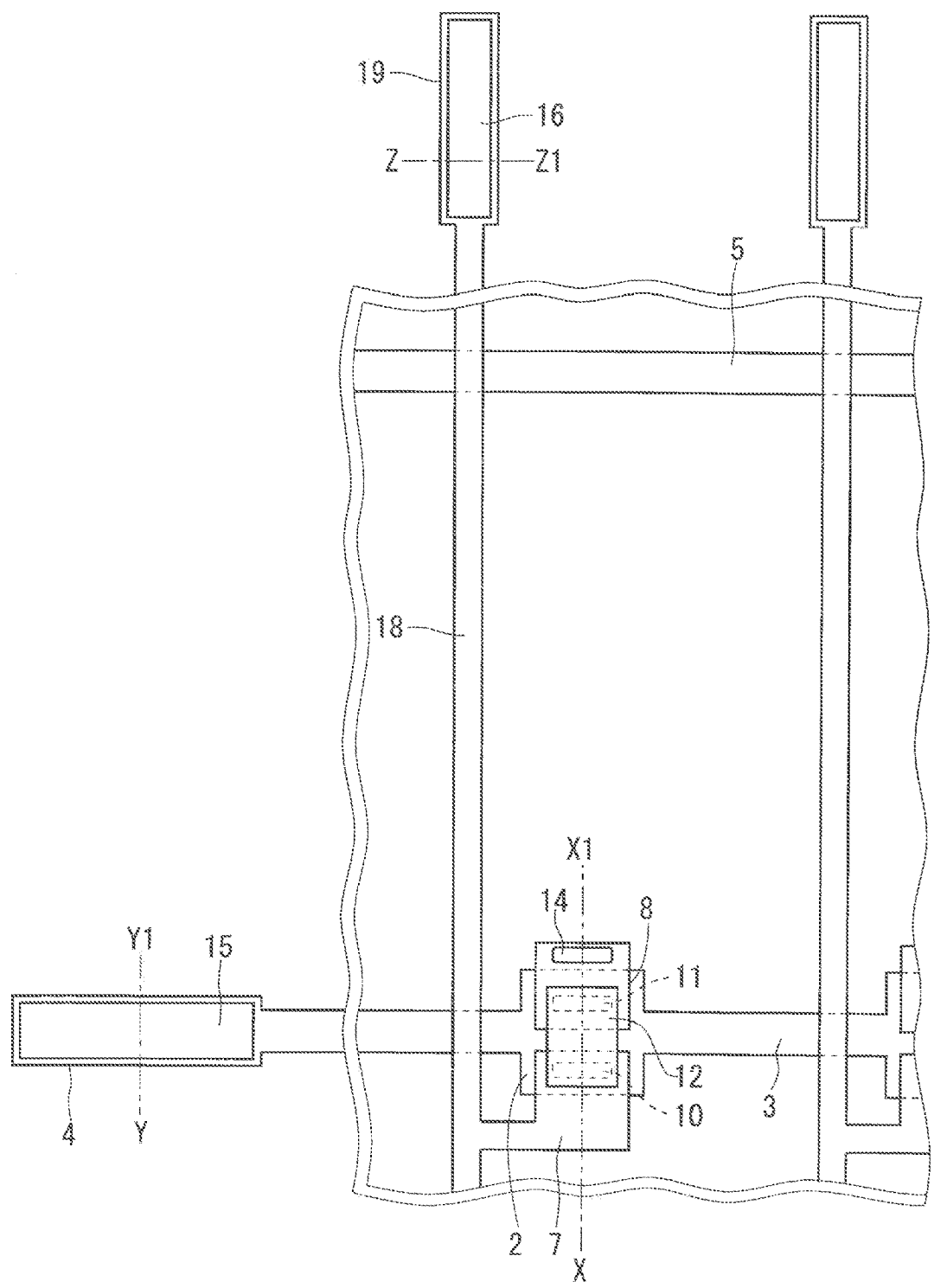
FIG. 11 is a plan view illustrating a method of manufacturing the TFT substrate according to the embodiment 1.

Accordingly, the third contact hole 14 in the pixel portion, the fourth contact hole 15 in the gate terminal portion, and the fifth contact hole 16 in the source terminal portion are formed as illustrated in FIG. 11 and FIG. 12. Then, the photoresist pattern not shown is removed.

Then, a third conductive film is deposited on the third insulating film 13, and on the drain electrode 8, the gate terminal 4, and the source terminal 19, for example, which are exposed from each contact hole. In the embodiment 1, a transparent conductive film such as a light-transmissive oxide-based conductive film is used as the third conductive film. For example, the light-transmissive conductive film is an ITO film in which a mixing ratio of indium oxide ($In_2O_3$) and tin oxide ($SnO_2$) is 90:10 in weight percentage. In general, the ITO film has a crystalline structure such as a polycrystalline structure with stability at room temperature. Herein, an ITO film having a thickness of 100 nm and being in the amorphous state is deposited by sputtering using a gas containing H such as a mixture gas of Ar and $H_2$ gas or water vapor $H_2O$.

Then, a photoresist pattern is formed in a sixth photolithography process, and the ITO film which is the third conductive film is etched to be patterned, using the photoresist pattern as a mask. The ITO film is wet-etched with an oxalic-acid-based chemical solution containing 5 wt % oxalic acid and water.

Accordingly, formed as illustrated in FIG. 13 and FIG. 14 are the pixel electrode 17 which is electrically connected to the drain electrode 8 via the third contact hole 14 on the drain electrode 8, the gate terminal pad 21 which is electrically connected to the gate terminal 4 via the fourth contact hole 15 on the gate terminal 4, and the source terminal pad 22 which is electrically connected to the source terminal 19 via the fifth contact hole 16 on the source terminal 19. Then, the photoresist pattern not shown is removed.

Consequently, the TFT substrate illustrated in FIG. 1 and FIG. 2 for use in the TN-LCD is completed. According to the manufacturing method described above, the source electrode 7 and the drain electrode 8 are formed as the lower layer of the second insulating film 9 which is the protective insulation layer, and the semiconductor channel layer 12 including the oxide semiconductor is formed as the upper layer of the second insulating film 9. The semiconductor channel layer 12 including the oxide semiconductor can therefore suppress the reduction during the film deposition and the damage by the etching, at the time of forming the source electrode 7 and the drain electrode 8, thus the influence on the semiconductor channel layer 12 and the degradation in the TFT characteristics can be suppressed.

During the assembly of the liquid crystal display panel, an alignment film and a spacer are formed on the upper surface of the completed TFT substrate. The alignment film is a film for aligning liquid crystals and is made of, for example, polyimide. A counter substrate (not shown) including a color filter and an alignment film that have been individually produced is bonded to the TFT substrate according to the embodiment 1 with the spacer described therebetween, for example. At this time, the TFT substrate and the counter substrate have a clearance formed by the spacer located therebetween. A liquid crystal layer is sealed in the clearance, thus the liquid crystal panel in various modes is formed. Finally, a polarizing plate, a phase difference plate, and a backlight unit, for example, are disposed on an outer side of the liquid crystal display panel, thus the liquid crystal display device is completed.

Conclusion of Embodiment 1

As described above, since the oxide semiconductor film having the high mobility is applied to the semiconductor channel layer 12 of the TFT in the embodiment 1, the high performance TFT can be achieved. In the embodiment 1, the source electrode 7 and the drain electrode 8 are disposed as the lower layer of the second insulating film 9 which is the protective insulation layer, and the semiconductor channel layer 12 is disposed as the upper layer of the second insulating film 9. The damage on the semiconductor channel layer 12 caused by the forming process of manufacturing the source electrode and the drain electrode can be prevented. A substantial channel length in the semiconductor channel layer 12 corresponds to a length between the first and second contact holes 10 and 11. As a result, the length between the first and second contact holes 10 and 11 can be relatively increased, thus the channel length can be substantially increased. Thus, a short channel effect can be suppressed, and the degradation in the TFT characteristics caused by the short channel effect can be suppressed.

In the embodiment 1, since the third insulating film 13 disposed on the semiconductor channel layer 12 includes the silicon oxide film as the upper layer and the silicon nitride film as the lower layer, the barrier properties against the impurity elements affecting the TFT characteristics can be enhanced.

Embodiment 2

A configuration according to the embodiment 2 of the present invention is described with reference to FIG. 15 and FIG. 16. The same or similar reference numerals as those described in the embodiment 1 will be assigned to the same constituent element described in the embodiment 2 and the repetitive description thereof will be omitted hereinafter.

Figure 15:
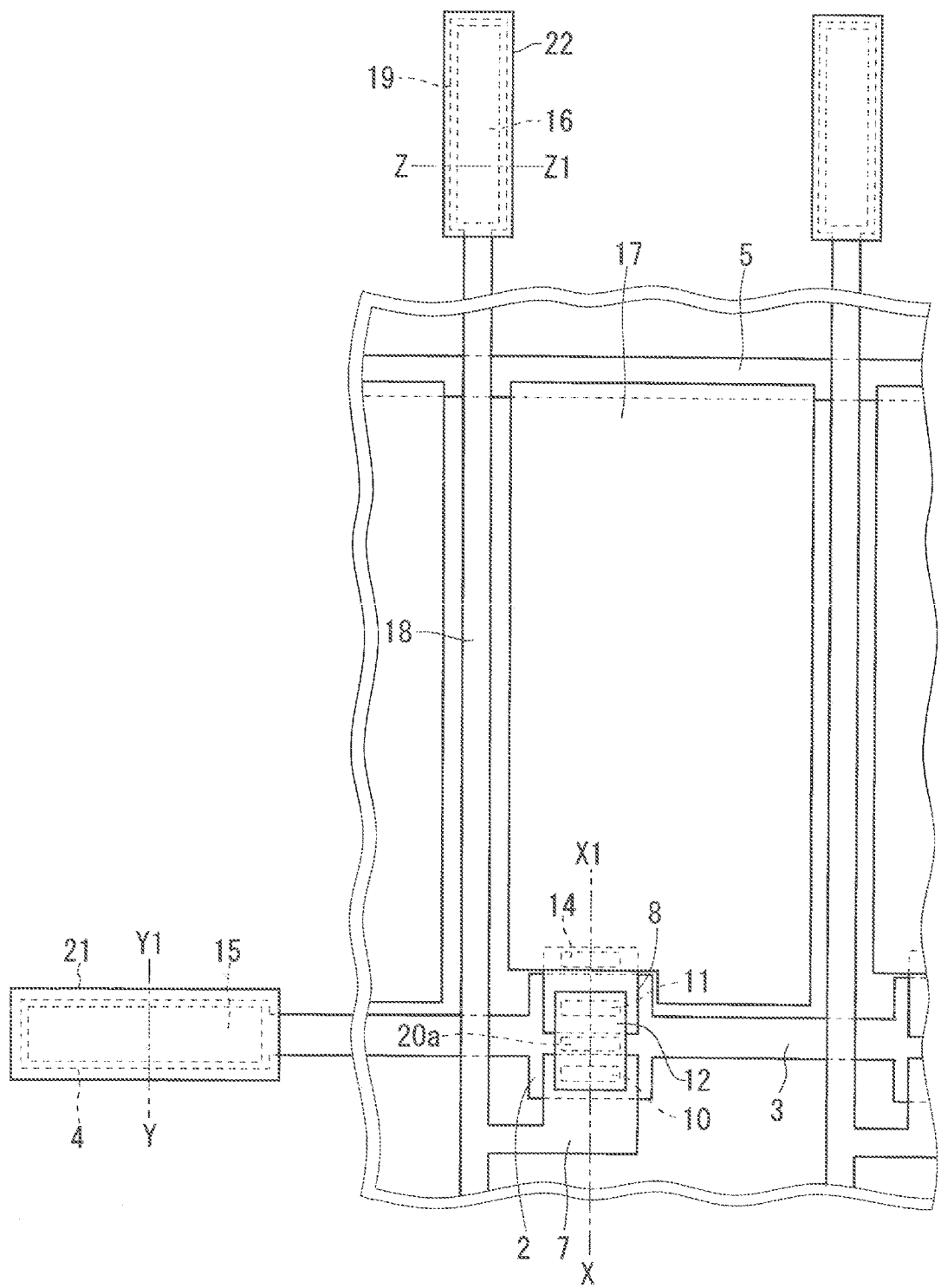
FIG. 15 is a plan view illustrating a configuration of a TFT substrate according to an embodiment 2.

FIG. 15 is a planar view of a planar configuration of the pixel portion in the pixel display region in the TFT substrate in the TN mode and the gate terminal portion and the source terminal portion outside the pixel display region in the TFT substrate, and FIG. 16 is a cross-sectional view of the cross-sectional configuration of these portions. FIG. 16 corresponds to cross sections taken along the line X-X1, the line Y-Y1, and the line Z-Z1 illustrated in FIG. 15. The cross section taken along the line X-X1 corresponds to a part of the pixel portion being the region in which pixels are formed. The cross section taken along the line Y-Y1 corresponds to the gate terminal 4 for supplying the gate signal to the gate wire 3 (not shown in FIG. 2). The cross section taken along the line Z-Z1 corresponds to the source terminal 19 for applying the display signal to the source wire 18 (not shown in FIG. 2). As shown in FIG. 16, the cross section of the pixel portion includes, along the line X-X1, "the TFT portion" being the region in which the TFT is formed and "the pixel electrode portion" being the region in which the pixel electrode 17 is formed.

In the embodiment 1 described with reference to FIG. 1 and FIG. 2, the second insulating film 9, which is formed below the channel region of the semiconductor channel layer 12 made up of the oxide semiconductor film, is relatively flat. In contrast, in the embodiment 2 illustrated in FIG. 15 and FIG. 16, a step portion 20 is provided on an upper portion of the second insulating film 9 formed below the channel region of the semiconductor channel layer 12. That is to say, the step portion 20 is provided on the upper portion in the second insulating film 9 between the first contact hole 10 and the second contact hole 11.

Herein, as an example thereof, a through hole 20a is provided in the second insulating film 9, and the step portion 20 includes a bottom portion of the through hole 20a in the second insulating film 9 and the upper portion of the second insulating film 9 adjacent to the through hole 20a. The semiconductor channel layer 12 is disposed along a surface of the step portion 20.

<Manufacturing Method>

Next, a method of manufacturing the TFT substrate according to the embodiment 2 is described. However, the process of manufacturing the gate electrode 2, the source electrode 7, the drain electrode 8, the semiconductor channel layer 12, the first to fifth contact holes 10, 11, 14, 15, and 16, and the pixel electrode 17 is similar to the method described in the embodiment 1, so that the description is omitted, and a process of manufacturing the second insulating film 9 which is the protective insulation layer is described hereinafter.

As illustrated in FIG. 5 and FIG. 6, after forming the source electrode 7, for example, on the first insulating film 6, the second insulating film 9 which is the protective insulation layer is deposited on the first insulating layer 6, the source electrode 7, and the drain electrode 8. Then, the photoresist pattern is formed in the third photolithography process, and the second insulating film 9 is etched to be patterned, using the photoresist pattern as the mask.

Figure 7:
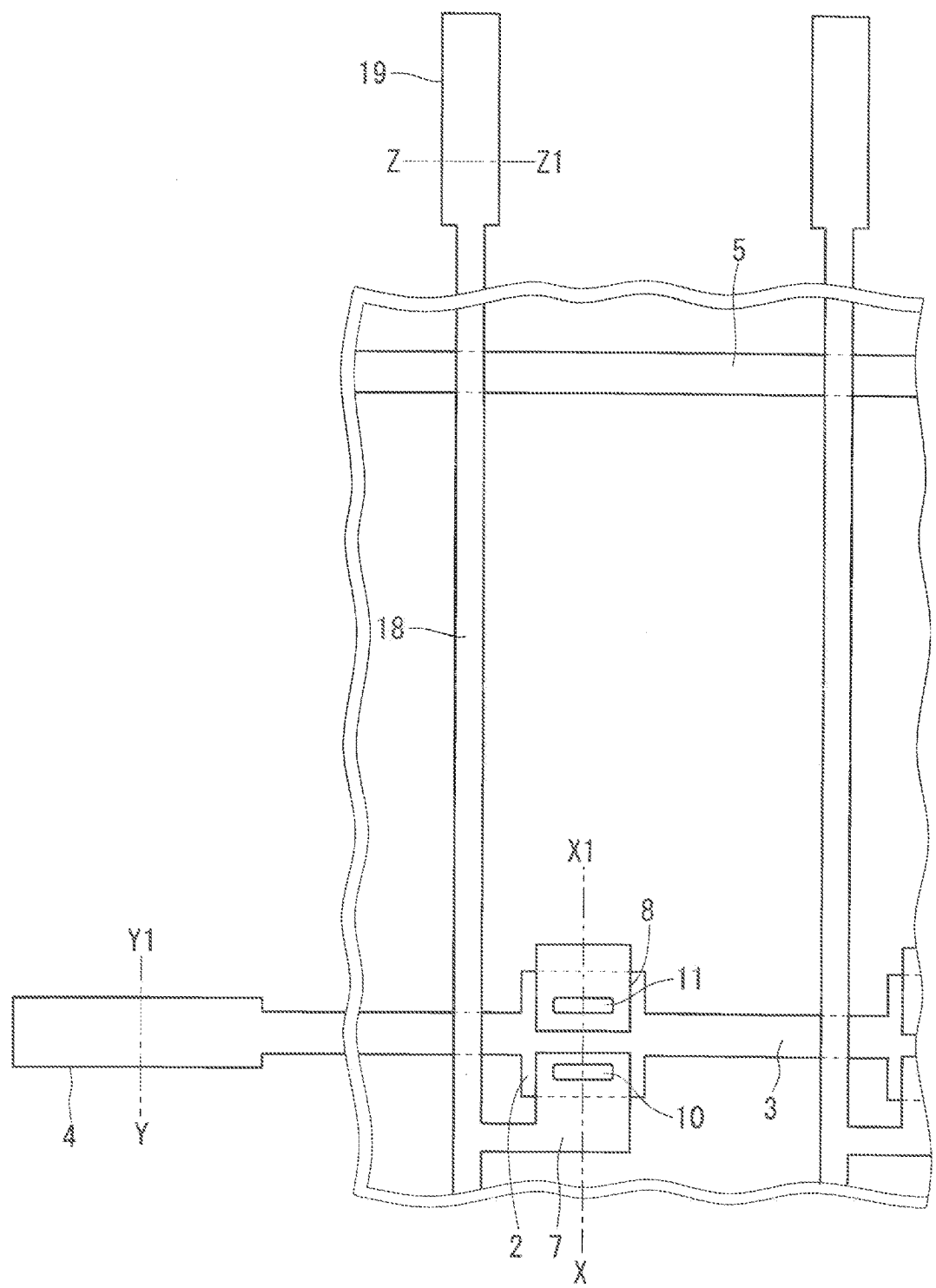
FIG. 7 is a plan view illustrating a method of manufacturing the TFT substrate according to the embodiment 1.
Figure 8:
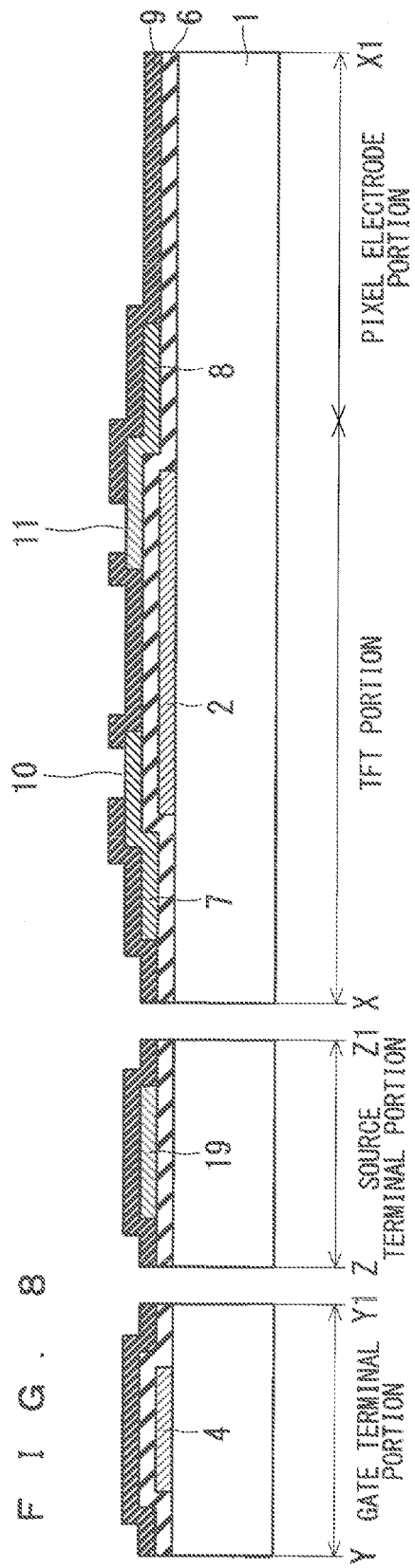
FIG. 8 is a cross-sectional view illustrating a method of manufacturing the TFT substrate according to the embodiment 1.

Herein, in the embodiment 1 described above, the first contact hole 10 and the second contact hole 11 are formed in the second insulating film 9 as illustrated in FIG. 7 and FIG. 8. In contrast, in the embodiment 2, in addition to the above configuration, the through hole 20a and the step portion 20 are formed in a region in the second insulating film 9 overlapping the semiconductor channel layer 12.

Then, the process of forming the semiconductor channel layer 12 and the subsequent process are performed in a manner similar to the embodiment 1 to form the semiconductor channel layer 12 along a surface of the step portion 20 and form the third to fifth contact holes 14, 15, and 16 and the pixel electrode 17.

Conclusion of Embodiment 2

According to the embodiment 2 as described above, the configuration is similar to the embodiment 1, thus the high performance TFT can be achieved, the damage on the semiconductor channel layer 12 can be reduced, and the degradation in the TFT characteristics due to the short channel effect can be suppressed.

In the embodiment 2, the step portion 20 is provided on the upper portion of the second insulating film 9 below the semiconductor channel region made up of the oxide semiconductor film. Accordingly, the semiconductor channel region can be elongated, thus the degradation in the TFT characteristics due to the short channel effect can be further suppressed.

Moreover, in the embodiment 2, the step portion 20, the first contact hole 10, and the second contact hole 11 are formed in the common photolithography process, thus the effect described above can be obtained without increasing the process.

Modification Example

Although the embodiments 1 and 2 describe the TFT substrate in the TN mode, the configuration is not limited thereto, but the embodiments 1 and 2 can also be applied to a TFT substrate in a VA mode, an IPS mode, or a FFS mode, for example.

Moreover, in the embodiment 2, although the through hole 20a is formed to form the step portion 20, the configuration is not limited thereto, but the step portion 20 may be formed by forming a convex-shaped film not shown in the drawings, for example.

According to the present invention, the above embodiments can be arbitrarily combined, or each embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A thin film transistor, comprising:
a gate electrode being disposed on a substrate;
a first insulating film covering said gate electrode;
a source electrode and a drain electrode being disposed on said first insulating film and separated from each other on an upper side of said gate electrode;
a second insulating film being disposed on said first insulating film, said source electrode, and said drain electrode; and
a semiconductor channel layer including an oxide semiconductor to be electrically connected to said source electrode and said drain electrode via a first contact hole and a second contact hole provided in said second insulating film.

2. The thin film transistor according to claim 1, wherein
a step portion is provided on an upper portion in said second insulating film between said first contact hole and said second contact hole, and
said semiconductor channel layer is disposed along a surface of said step portion.

3. The thin film transistor according to claim 2, wherein
a through hole is provided in said second insulating film, and
said step portion includes a bottom portion of said through hole in said second insulating film and an upper portion of said second insulating film adjacent to said through hole.

4. The thin film transistor according to claim 1, further comprising
a third insulating film being disposed on said semiconductor channel layer to include a silicon oxide film as an upper layer and a silicon nitride film as a lower layer.

5. The thin film transistor according to claim 1, wherein
said semiconductor channel layer is disposed on an upper side of said gate electrode and also disposed on at least one of said second insulating film, said source electrode, and said drain electrode.

6. A thin film transistor substrate, comprising:
said thin film transistor according to claim 1; and
a pixel electrode being electrically connected to said drain electrode via a contact hole in said second insulating film.

7. A thin film transistor substrate, comprising:
said thin film transistor according to claim 1;
a common wire being disposed on said substrate to be separated from said gate electrode and covered by said first insulating film;
a third insulating film disposed on said second insulating film and said semiconductor channel layer;
a pixel electrode being electrically connected to said drain electrode via a third contact hole provided in said second insulating film and said third insulating film;
a gate terminal pad being electrically connected to said gate electrode via a fourth contact hole provided in said first insulating film, said second insulating film, and said third insulating film; and a source terminal pad being electrically connected to said source electrode via a fifth contact hole provided in said second insulating film and said third insulating film.

8. A liquid crystal display device, comprising:

said thin film transistor substrate according to claim 6; and a counter substrate being disposed opposite to said thin film transistor substrate with a liquid crystal layer therebetween.

9. A method of manufacturing the thin film transistor according to claim 2, wherein said step portion, said first contact hole, and said second contact hole are formed in a common photolithography process.

* * * * *